(12) United States Patent
Cho (10) Patent No.: US 7,201,280 B2
(45) Date of Patent: Apr. 10, 2007

(54) WAFER BOAT FOR CONSOLIDATION OF POROUS THIN LAYER

(75) Inventor: Jae-Geol Cho, Suwon-shi (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 404 days.

(21) Appl. No.: 10/452,988

(22) Filed: Jun. 3, 2003

(65) Prior Publication Data

US 2004/0115958 A1 Jun. 17, 2004

(30) Foreign Application Priority Data

Dec. 12, 2002 (KR) ........................ 10-2002-0079112

(51) Int. Cl.
*A47G 19/08* (2006.01)
(52) U.S. Cl. .................................... 211/41.18
(58) Field of Classification Search ............. 211/41.18, 211/40, 41.1; 432/258, 218
See application file for complete search history.

(56) References Cited

U.S. PATENT DOCUMENTS

| | | | |
|---|---|---|---|
| 5,577,621 A * | 11/1996 | Yi ............................ | 211/41.18 |
| 6,099,302 A * | 8/2000 | Hong et al. ................. | 432/259 |
| 6,287,112 B1 * | 9/2001 | Van Voorst Vader et al. ......................... | 432/258 |
| 6,617,540 B2 * | 9/2003 | Zehavi ................... | 219/121.64 |
| 6,796,439 B2 * | 9/2004 | Araki ....................... | 211/41.18 |

\* cited by examiner

*Primary Examiner*—Sarah Purol
(74) *Attorney, Agent, or Firm*—Cha & Reiter, LLC (57) ABSTRACT

A wafer boat for consolidation of a porous oxide layer structure is provided. The wafer boat includes at least one support plate including: a first plate for supporting a substrate with the porous oxide layer by face-to-face contact; a second plate radially extending from a periphery of the first plate; and a stepped portion for limiting movement of the substrate formed with a predetermined height along a border line between the first plate and the second plate. The wafer boat also includes a support plate supporting the edge of the wafer to be consolidated, so that it is possible to prevent the porous layer of a wafer located underneath from being damaged by the falling particles from the broken particles from the porous layer of the wafer located at the upper side. Also, the omission of a dummy wafer can reduce the size of the consolidation furnace, and the automation system and the process can be simplified leading to reduction of the production cost. In addition, since a stepped portion is provided for limiting movement of the wafer mounted on the wafer boat, damage to the porous layer of the wafer due to contact of the wafer with the support rod can be prevented.

14 Claims, 10 Drawing Sheets

WAFER BOAT FOR CONSOLIDATION OF POROUS THIN LAYER

CLAIM OF PRIORITY

This application claims priority to an application entitled "Wafer boat for consolidation of porous thin layer," filed in the Korean Intellectual Property Office on Dec. 12, 2002 and assigned Serial No. 2002-79112, the contents of which are hereby incorporated by reference.

BACKGROUND OF THE INVENTION

1. Field of the invention

The present invention relates to a device for fabricating a thin layer on a silicon wafer. More particularly, the present invention relates to a wafer boat for use in a consolidation process after a deposition of silica layer.

2. Description of the Related Art

In the prior art, oxide layers for the fabrication of a planar light-wave circuit are produced through a flame hydrolysis deposition process. The flame hydrolysis deposition includes deposition of oxide particles, such as $SiO_2$, $GeO_2$, $P_2O_5$, or $B_2O_3$ onto a silicon substrate or a quartz substrate, and then a subsequent consolidation process. In the process of the flame hydrolysis deposition, the source material is injected into a flame in order to form fine particles through hydrolysis reaction or the oxidation in the flame. The fine particles formed are coagulated through collision with each other while moving through the flame, and are deposited to the silicon substrate or the quartz substrate by thermophoresis. The particles deposited onto the substrate such a porous oxide layer having been deposited is mounted onto a wafer boat and introduced into a furnace to perform the consolidation process.

Figure 1:
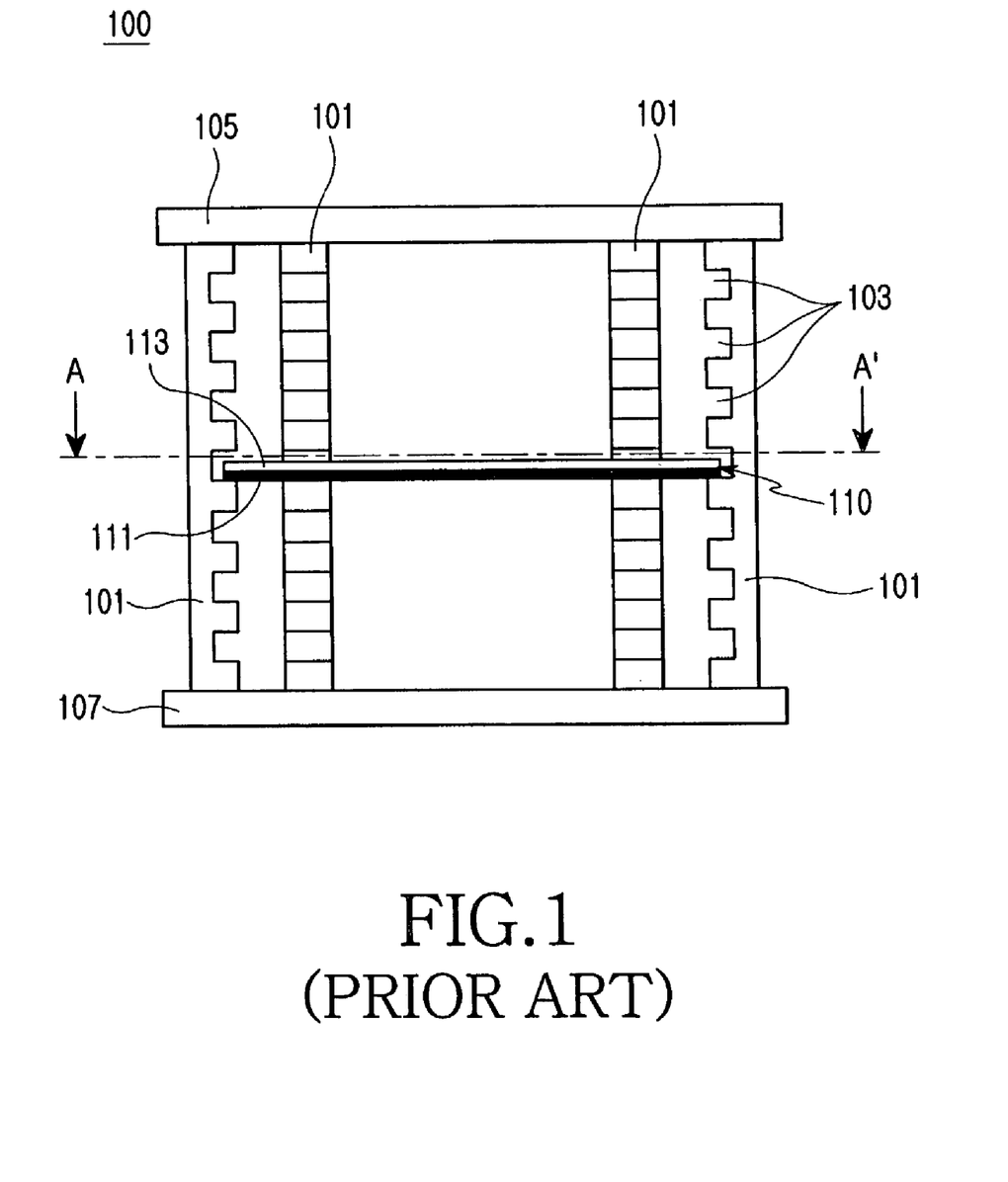
FIG. 1 is a side view of a wafer boat according to the prior art.
Figure 2:
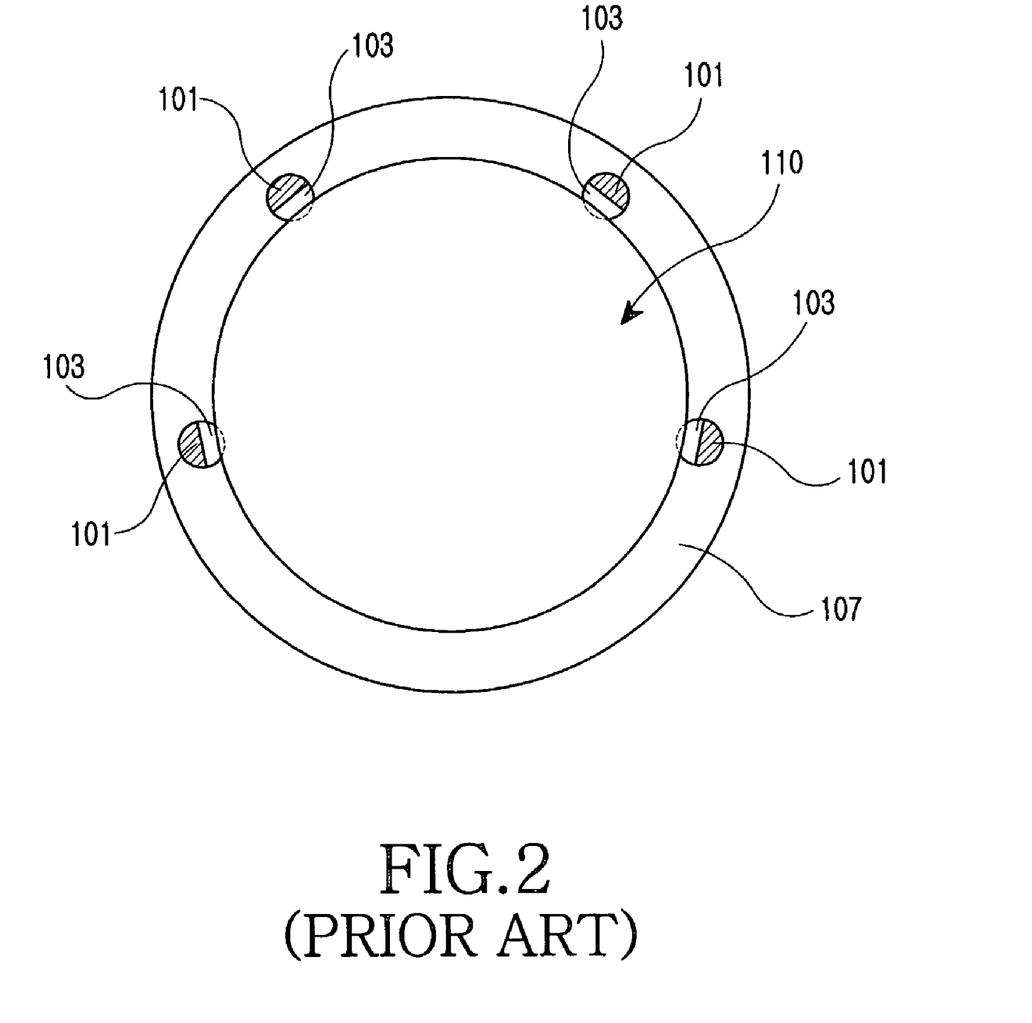
FIG. 2 is a cross-sectional top view taken along a line A–A' of FIG. 1.

FIG. 1 is an illustration of a side view of a wafer boat 100 according to an embodiment of the prior art, and FIG. 2 is a cross-sectional top view taken along a line A–A' of FIG. 1. As shown in FIGS. 1 and 2, a wafer boat 100 for consolidation of porous layer according to the prior art includes an upper plate 105, a lower plate 107 and four support rods 101. Alternately, three, five or even more support rods may be installed.

The rods 101 are fixed between the upper plate 105 and the lower plate 107. A plurality of fixture slots 103 are formed along each of the support rods 101 with equal distances to each other. A plurality of silicon or quartz wafers 110 on which the porous layers 113 are formed are mounted in the equally distanced fixture slots 103.

Because the porous silica layer 113 formed by the flame hydrolysis deposition has a tendency to be damaged or broken even through very light contact, or an impact from the exterior, careful attention should be paid to the handling of the wafer 110 when it is mounted on the wafer boat 100 for consolidation after the deposition process. In particular, the porous layer 113 may be damaged by contact with the support rods 101 while mounting the wafer 110 onto the wafer boat 100 after the deposition. Further, it may be damaged by movement of the wafer 110 due to the vibration or sway of the wafer boat 100 after mounting the wafer 110 to the wafer boat 100.

Also, when the consolidation process is terminated, there are instances when the porous silica layer 113 is formed in such a state that a portion thereof protrudes from the edge of the substrate 111. In this state, the thin layer protruding out of the substrate edge is extremely vulnerable to breakage even by the slightest impact, resulting in the broken particles falling down onto another wafer mounted underneath, which in turn causes other defects in the products.

In order to prevent the broken particles from falling down onto a lower wafer or to facilitate the easiness of handling of the wafer with the porous layer, a dummy wafer 120 (FIG. 3) may be employed.

Figure 3:
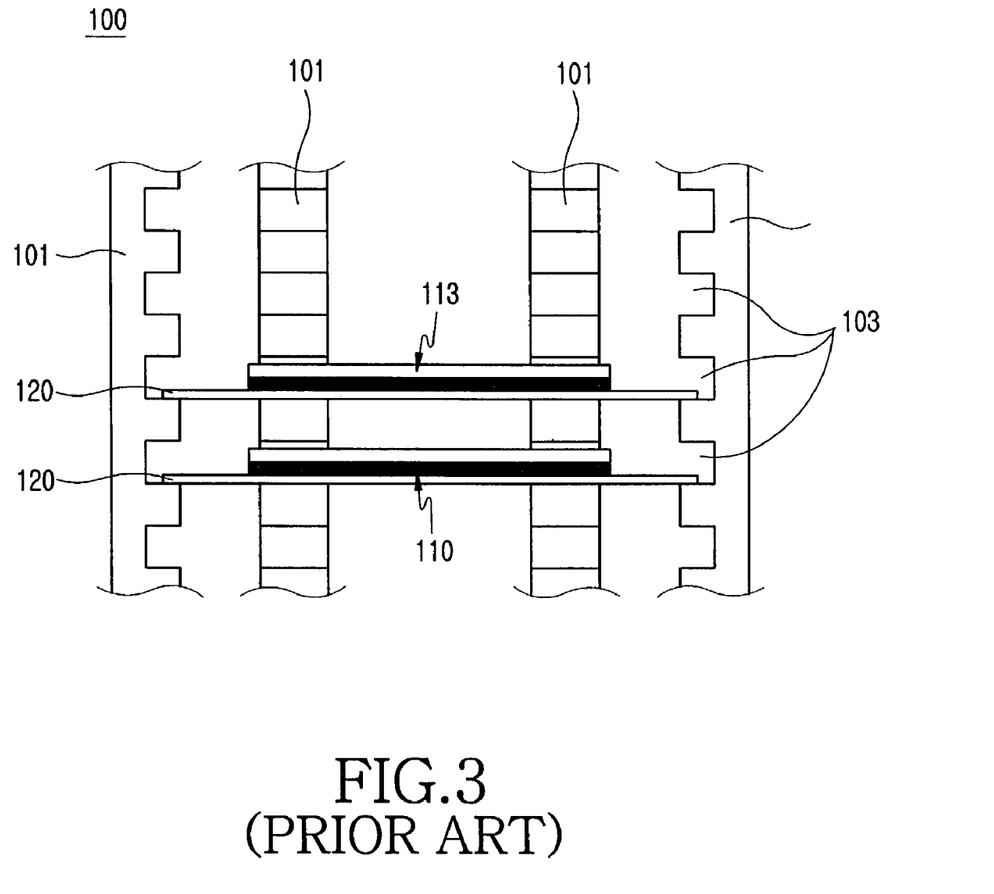
FIG. 3 is a side view showing a dummy wafer mounted to the wafer boat shown in FIG. 1.

FIG. 3 is a side view showing the dummy wafer 120 mounted to the wafer boat 100. Since the dummy wafer 120 has a diameter larger than that of the wafer 110 to be consolidated, particles having been broken off the porous silica layer 113 of the wafer 110 can be prevented from falling down to a wafer located underneath. Also, since a wafer is not properly supported by the support rods 120 when the wafer is small-sized, a dummy wafer 120 may be used.

Generally, a silicon wafer is used as the dummy wafer 120.

However, the surface of the dummy wafer will be oxidized leading to crystallization because the consolidation process is performed at a high temperature of about 1300° C. Fine crystals formed on the surface of the dummy wafer will fall down to another wafer located underneath, causing the defects in the oxide layer on the wafer. Thus, the dummy wafer should be replaced after a predetermined period. Alternatively, a dummy wafer made of SiC material may be used that becomes relatively less oxidized at a high temperature. However, such a solution increases production costs. Further, since the method utilizing the dummy wafer should employ a dummy wafer larger than the substrate to be consolidated, the size of the consolidation furnace increases accordingly. Also, in a case in which the mounting of the substrate is automated, a complicated wafer automation system is required so as to make use of the dummy wafer, and the operation of the automation system also will be complicated.

SUMMARY OF THE INVENTION

One aspect of the present invention is to provide a wafer boat with a structure that prevents particles from a porous oxide layer of a wafer from falling down to another oxide layer of another wafer located underneath.

Another aspect of the present invention is to provide a wafer boat in which it is possible to obviate the need to enlarge the consolidation furnace and to facilitate a wafer automation system.

Another aspect of the present invention is to provide a wafer boat in which it is possible to prevent a porous oxide layer of a wafer from being damaged due to contact with other structures, such as support rods, by limiting movement of the wafer mounted to the wafer boat.

In one embodiment, there is provided a wafer boat for consolidation of a porous silica layer, the wafer boat comprising at least one support plate which includes: a first plate for supporting a substrate with the porous silica layer by face-to-face contact; a second plate radially extending from a periphery of the first plate; and a stepped portion for limiting movement of the substrate formed with a predetermined height along a border line between the first plate and the second plate.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. For the purposes of clarity and simplicity, the same reference numerals are used to designate the same or similar components, and so repetition of the description on the same or similar components will be omitted.

Figure 4:
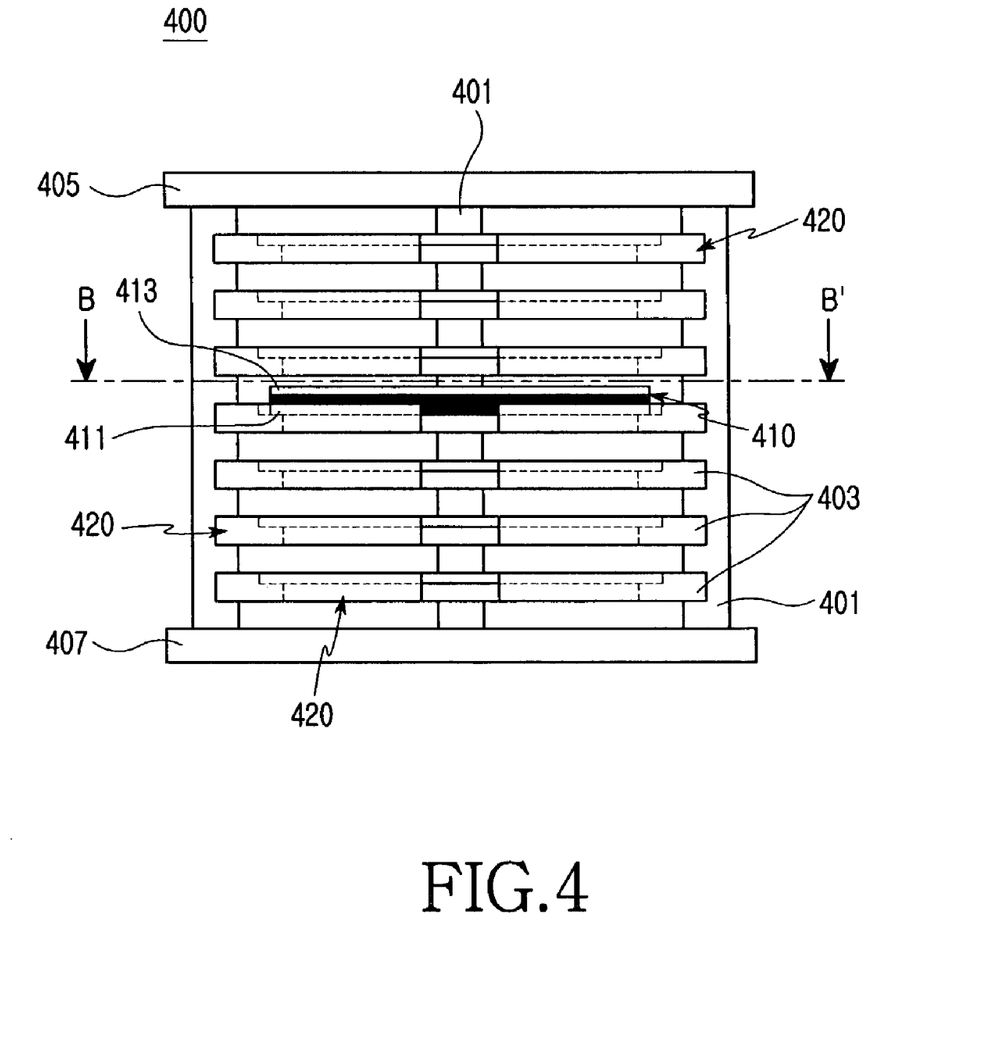
FIG. 4 is a side view of a wafer boat for consolidation of porous silica thin layer according to an embodiment of the present invention.
Figure 5:
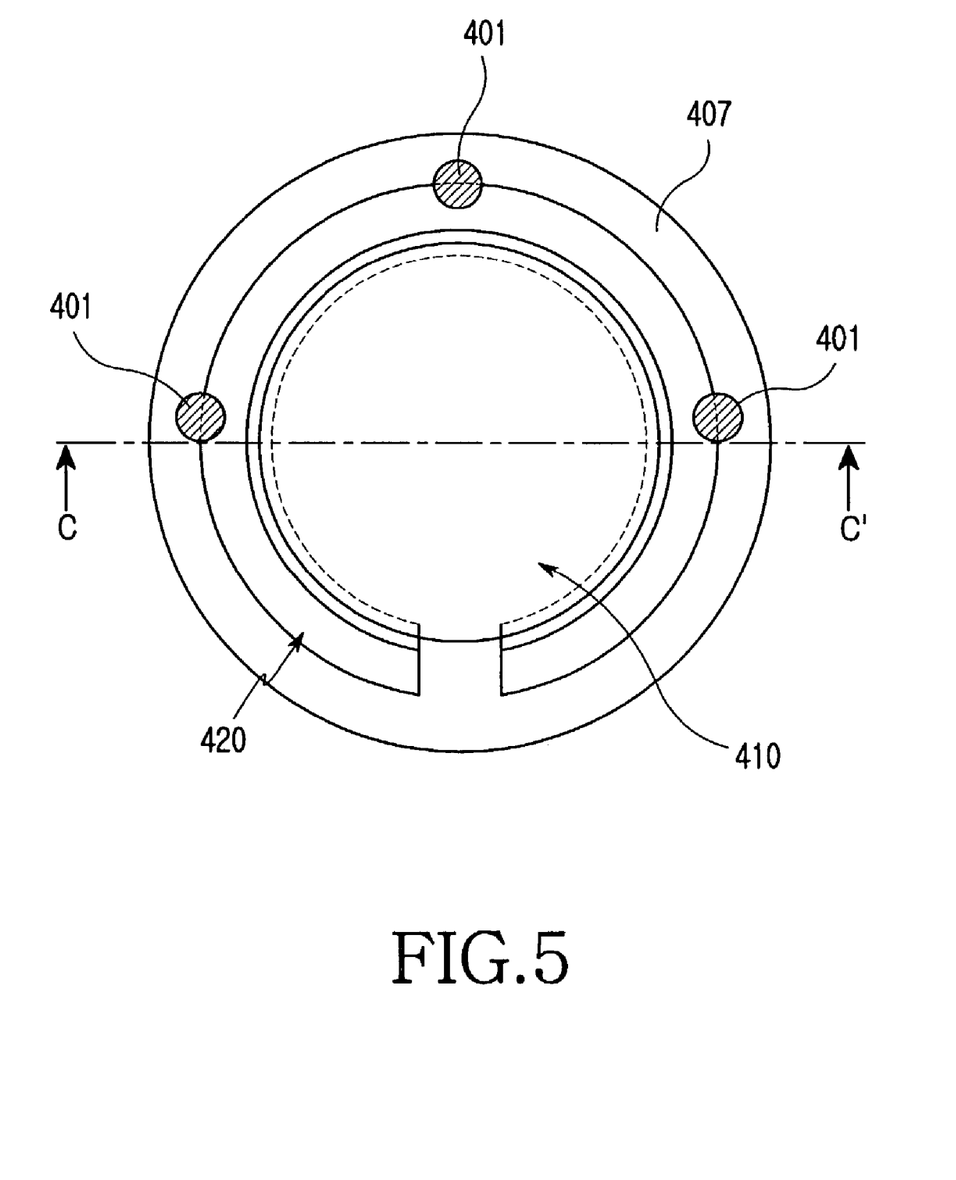
FIG. 5 is a cross-sectional top view taken along a line B–B' of FIG. 4.
Figure 6:
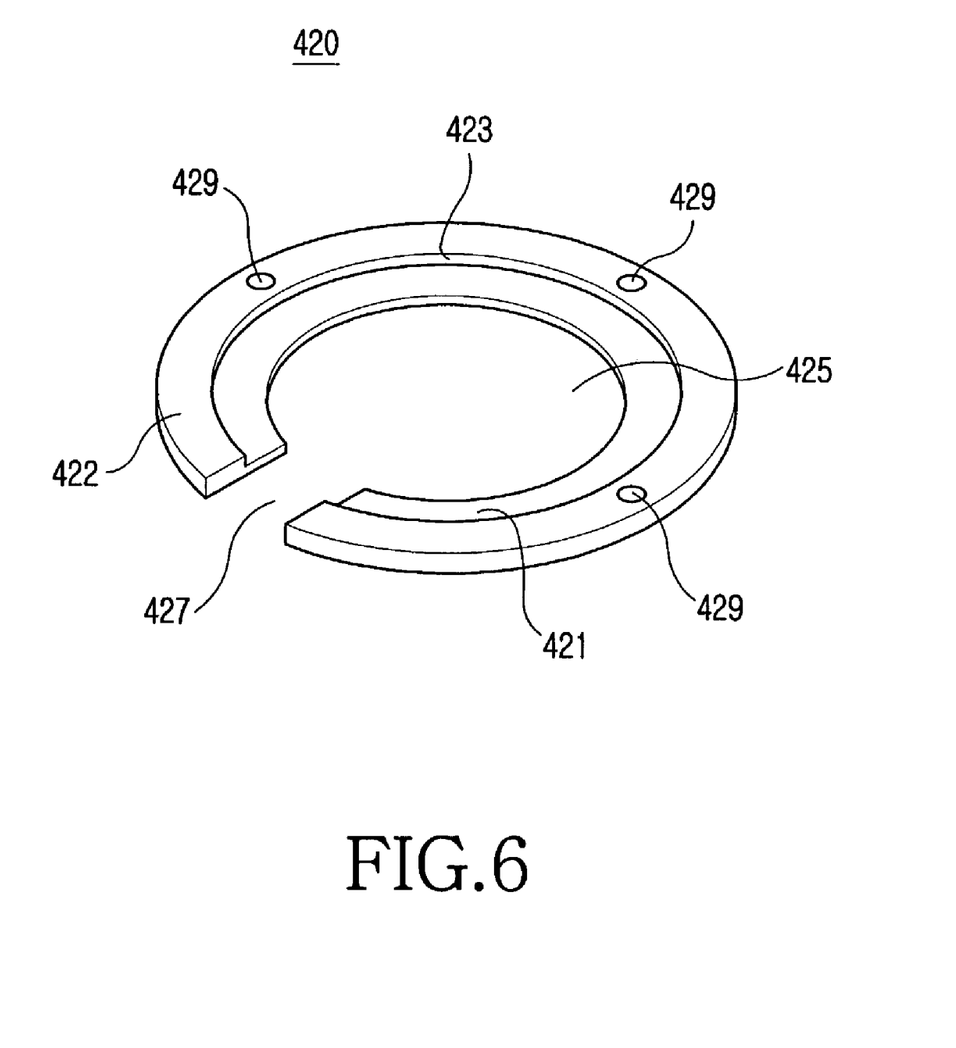
FIG. 6 is a perspective view of a support plate shown in FIG. 4.
Figure 7:
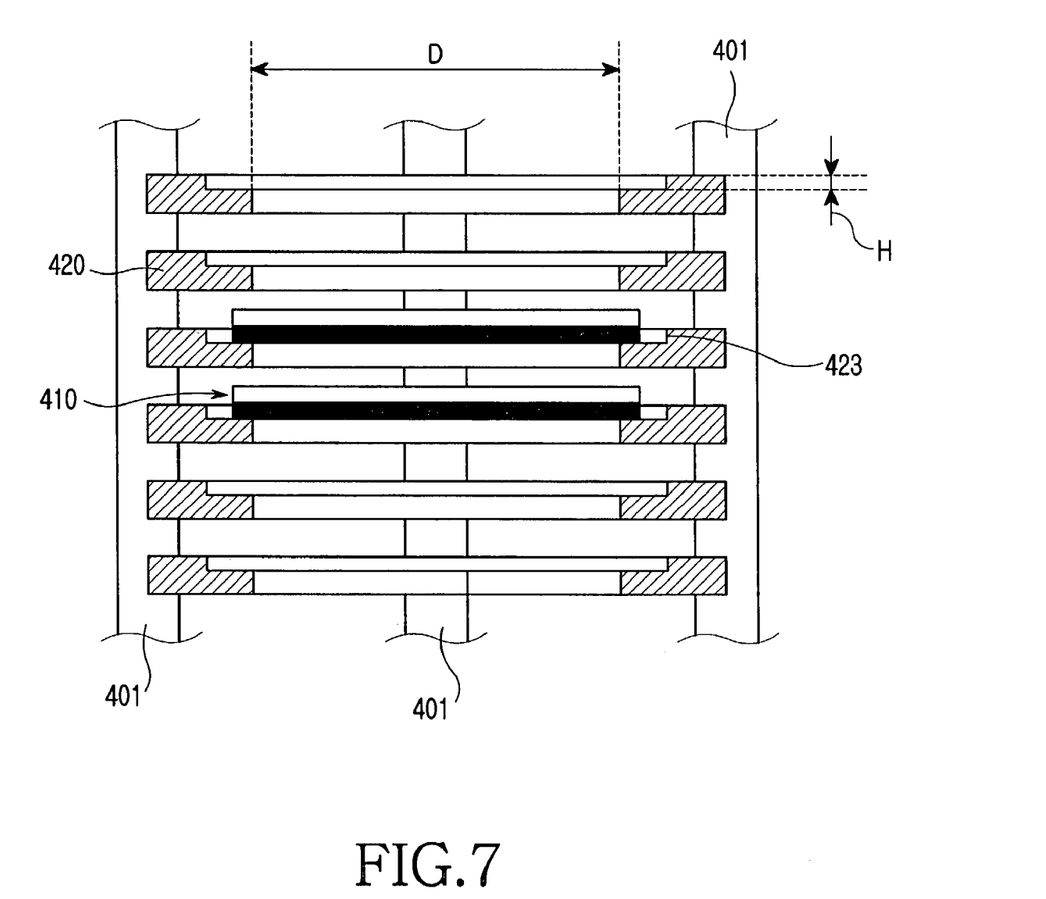
FIG. 7 is a cross-sectional side view taken along a line C–C' of FIG. 5.

FIG. 4 is a side view of a wafer boat 400 for consolidation of a porous oxide layer according to a preferred embodiment of the present invention. FIG. 5 is a cross-sectional top view of the wafer boat 400 taken along a line B–B' of FIG. 4. FIG. 6 is a perspective view of a support plate 420 shown in FIG. 4. FIG. 7 is a cross-sectional side view of the wafer boat 400 taken along a line C–C' of FIG. 5.

As shown in FIGS. 4 to 7, the wafer boat 400 according to the preferred embodiment of the present invention includes an upper plate 405, a lower plate 407, three support rods 401 and a plurality of support plates 420.

Each of the support rods 401 is fixed between the upper plate 405 and the lower plate 407 and is formed with a plurality of equally-distanced fixture slots 403 along a longitudinal direction.

Referring to FIG. 6, each of the support plates 420 include a first plate 421 formed with a through-hole 425 with a predetermined diameter and a second plate 422 extending from a periphery of the first plate 421 in a radial direction. A stepped portion for limiting movement of a wafer 410 is formed with a predetermined height along a border line between the first plate 421 and the second plate 422. A plurality of coupling holes 429 are formed in the second plate 422. Also, the support plate 420 includes an opening 427 formed with a predetermined width extending from an outer periphery of the second plate 422 to the through hole 425. Accordingly, the support plate 420 has a shape similar to the alphabetic character "C". The opening 427 provides a space for treating the wafer 410 when mounting/dismounting the wafer 410 to/from the support plate 420.

By fixing the second plate 422 into the fixture slots 403, the support plates 420 are installed along the support rods 401 at equal distance.

The wafer 410 to be consolidated is mounted to the first plate 421. Thus, as a diameter D of the through-hole 425 formed in the first plate 421 is smaller than the diameter of the wafer 410 to be mounted to the support plate 420, the first plate 421 can support an edge of the wafer 410. It is evident that various sizes of wafers may be mounted depending on the diameter D of the through-hole.

The stepped portion 423 limits a movement range of the wafer 410 on the first plate 421, so that the damage to the porous oxide layer 413 on the substrate 411 of the wafer 410 due to contact with other structures, such as the support rods 401, will be prevented. Also, the height of the step 423 is smaller than the thickness of the substrate 411 of the wafer 410, preventing the stepped portion 423 from contacting to the porous oxide layer 413.

Since the wafer 410 is mounted onto the first plate 421, the latter prevents the particles broken off the porous oxide layer 413 on the wafer 410 from falling down to another wafer located at the lower side.

The fixture structure of the support plate and the support rods will be described herein below with reference to FIGS. 8 and 9.

Figure 8:
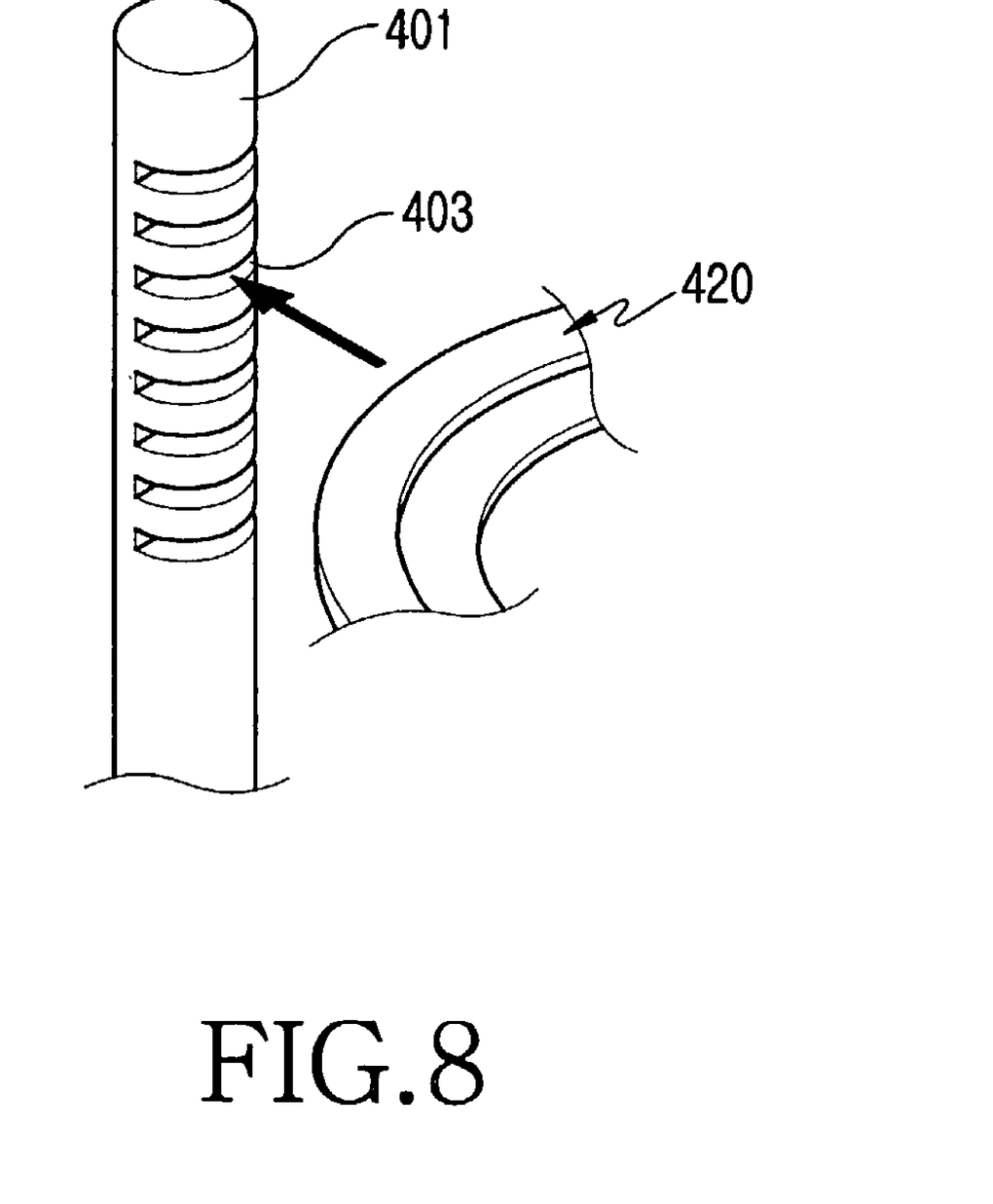
FIG. 8 is an exploded perspective view of a fixture structure for the support plate shown in FIG. 4.

FIG. 8 is an exploded perspective view showing the fixture structure for the support plate 420 and the support rods 401 shown in FIG. 4. As shown in FIG. 8, the edge of support plates 420 are inserted into the fixture slots 403 which are formed along the support rods 401 at equal distances in the longitudinal direction. The support rods can be considered to be part of a housing of the wafer boat for holding a plurality of stacked support plates spaced thereon.

Figure 9:
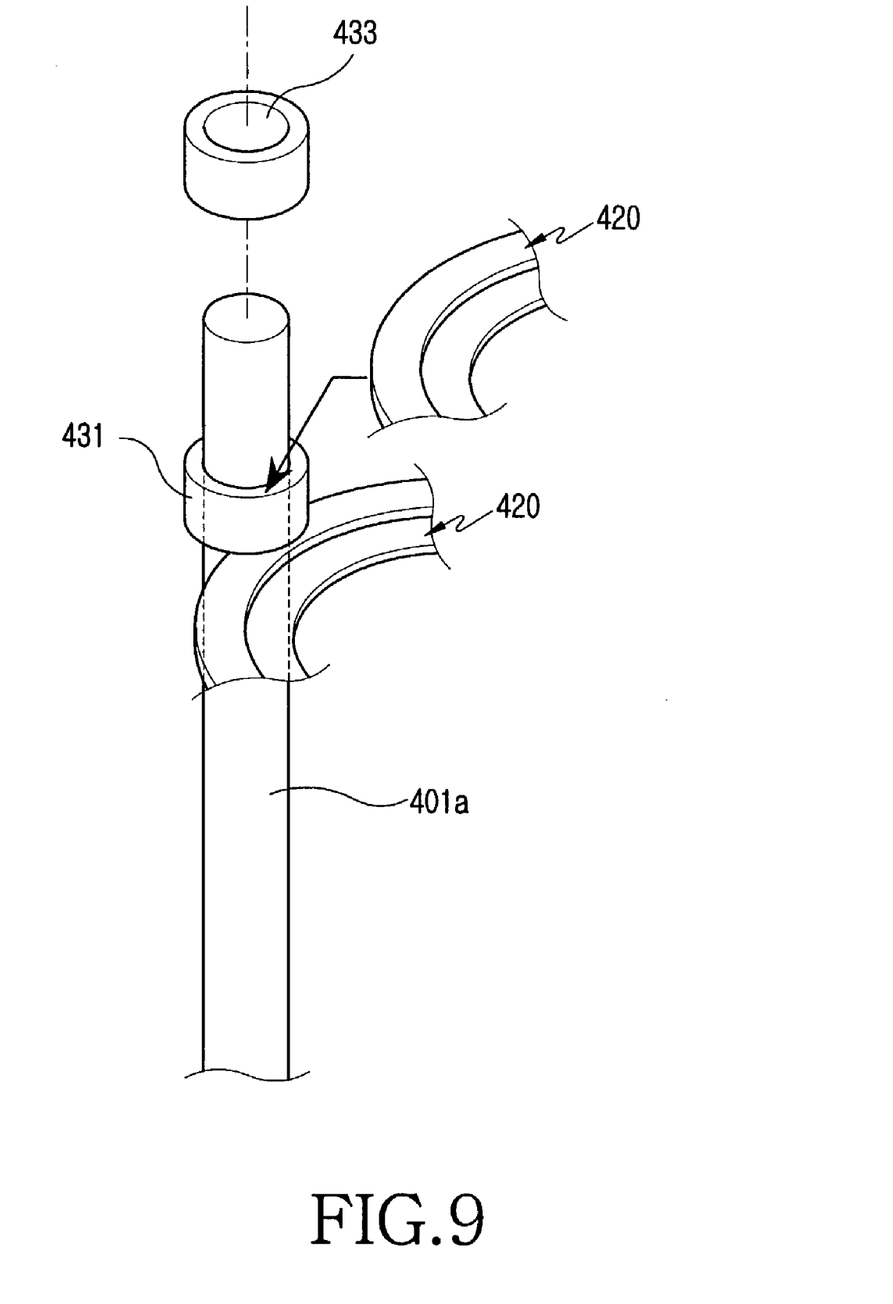
FIG. 9 is an exploded perspective view of another fixture structure for the support plate.

FIG. 9 is an exploded perspective view showing another embodiment of a fixture structure for the support plate 420 and the support rods 401. In the fixture structure for the support plate 420 and the support rods 401 shown in FIG. 9, there is provided with a plurality of spacers 431 formed with a coupling hole 433 through which the support rod 401 is inserted. The support plate 420 and the spacers 431 are alternately engaged with the support rods 401 and the distance between the support plates 420 engaged with the support rods 401 is determined by the length of the spacer 431. Here, the outer periphery of the support plate 420 contacts the outer periphery of the support rod 401.

Figure 10:
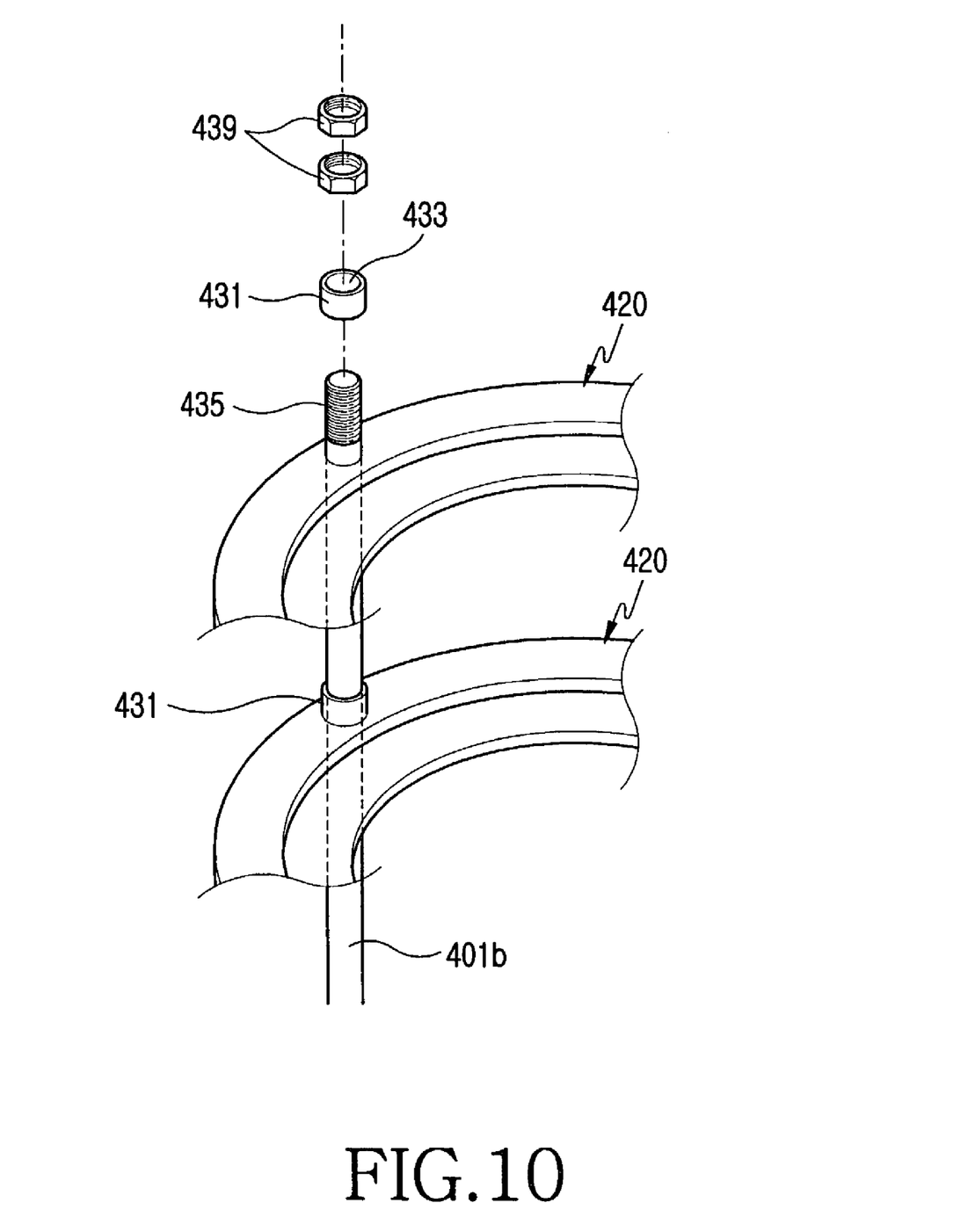
FIG. 10 is an exploded perspective view of another fixture structure for the support plate.

FIG. 10 is an exploded perspective view showing another embodiment of a fixture structure for the support plates 420 and the support rods 401. The fixture structure shown in FIG. 10 utilizes a coupling hole 429 (see FIG. 6) formed through the second plate 422. Also, the fixture structure shown in FIG. 10 includes a plurality of spacers 431 each formed with a coupling hole 433 through which a support rod 401 is inserted. The support plates 420 and the spacers 431 are alternately engaged with the support rod 401 and the distance between the support plates engaged with the support rod 401 is determined by the length of the spacers 431.

Here, a thread 435 is formed on an outer periphery of the upper end of each rod 401 and a nut 439 is engaged with the thread 435. Accordingly, the spacers 431 and the support plate 420 engaged with the support rods 401 are fixedly secured. It is evident that this type of securing means can be applied to the embodiment shown in FIG. 9. It is also possible that the support rods have a groove at an end and a c-clip (not shown) is arranged in the groove and serves as an alternate form of securing means.

In addition, the support rods could have a plurality of protruding portions (not shown) extending at equal distances from each other in a longitudinal direction, and each of the second plates having holes for engaging with the protruding portions to engage removably the second plates onto the support rods. Although a preferred embodiment of the present invention has been described for illustrative purposes, those skilled in the art will appreciate that various modifications, additions and substitutions are possible, without departing from the scope and spirit of the invention as disclosed in the accompanying claims.

As described above, the wafer boat according to the present invention includes a support plate supporting the edge of the wafer to be consolidated, so that it is possible to prevent the porous layer of the wafer located at the lower side from being damaged by falling particles from the porous layer of the wafer located above. Thus, it dispenses with a dummy wafer reducing the production cost. Also, the omission of the dummy wafer can reduce the size of the consolidation furnace, and the automation system and the process can be simplified because the mounting/dismounting of the dummy wafer is not needed. In addition, since there is provided with a stepped portion for limiting movement of the wafer mounted on the wafer boat, damage to the porous layer of the wafer due to the contact of the wafer with the support rods can be prevented.

What is claimed is:

1. A wafer boat for consolidation of a porous oxide layer, the wafer boat comprising at least one support plate which includes:
    a first plate configured to support a substrate with the porous oxide layer by face-to-face contact;
    a second plate radially extending from a periphery of the first plate;
    a stepped portion having a predetermined height, formed along a border line between the first plate and the second plate, the stepped portion configured to limit movement of the substrate;
    at least two support rods; and
    a plurality of spacers formed with a coupling-hole through which the support rods are engaged; wherein the spacers and support plates are alternately coupled with the support rods.

2. The wafer boat as recited in claim 1, wherein an end portion of the support rod is formed with a thread and a nut is engaged with the thread.

3. The wafer boat as recited in claim 1, wherein an end portion of the support rod has a groove formed thereon, and a c-clip is engaged in the groove.

4. The wafer boat as recited in claim 1, wherein a periphery of the support plate contacts the support rods so as to be coupled to each other.

5. The wafer boat as recited in claim 1, wherein the second plate is formed by having at least two coupling holes penetrating an upper and a lower surface thereof so that the support rods are received through the coupling holes of the second plate.

6. A method for providing a wafer boat for consolidation of a porous oxide layer, and said method comprising the following steps:
    (a) providing a first support plate for supporting a substrate with the porous oxide layer by face-to-face contact;
    (b) providing a second plate radially extending from a periphery of the first support plate; and
    (c) including a stepped portion having a predetermined height along a border line between the first support plate and the second plate, the stepped portion configured to limit movement of the substrate;
    (d) providing a housing having at least two support rods and a plurality of spacers formed with a coupling-hole through which the support rods are engaged, wherein the spacers and support plates are alternately coupled with the support rods.

7. The method as recited in claim 6, wherein an end portion of the support rod is formed with a thread and a nut is engaged with the thread.

8. The method as recited in claim 6, wherein an end portion of the support rod has a groove formed thereon, and a c-clip is engaged in the groove.

9. The method as recited in claim 6, wherein a periphery of the support plate contacts the support rods so as to be coupled to each other.

10. The method as recited in claim 6, wherein the second plate is formed by having at least two coupling holes penetrating an upper and a lower surface thereof so that the support rods are received through the coupling holes of the second plate.

11. The method as recited in claim 6, further comprising that a center of the first support plate provided in step (a) has a through-hole with a diameter smaller than that of the substrate is formed therein.

12. The method as recited in claim 11, wherein the first support plate provided in step (a) has an opening formed at a predetermined width extending from an outer periphery of the second plate to the through-hole, so that the support plate is substantially C-shaped.

13. The wafer boat as recited in claim 1, wherein the center of the first plate has a through-hole with a diameter smaller than that of the substrate is formed therein.

14. The wafer boat as recited in claim 13, further having an opening formed at a predetermined width extending from an outer periphery of the second plate to the through-hole, so that the support plate is substantially C-shaped.

* * * * *